United States Patent
Mizuno et al.

(10) Patent No.: US 8,148,755 B2
(45) Date of Patent: Apr. 3, 2012

(54) SOLID-STATE IMAGING DEVICE AND MANUFACTURING METHOD THEREOF

(75) Inventors: Ikuo Mizuno, Kyoto (JP); Mitsuyoshi Andou, Toyama (JP); Noriaki Suzuki, Kyoto (JP)

(73) Assignee: Panasonic Corporation, Osaka (JP)

( * ) Notice: Subject to any disclaimer, the term of this patent is extended or adjusted under 35 U.S.C. 154(b) by 309 days.

(21) Appl. No.: 12/691,919

(22) Filed: Jan. 22, 2010

(65) Prior Publication Data

US 2010/0193844 A1 Aug. 5, 2010

(30) Foreign Application Priority Data

Jan. 30, 2009 (JP) ................. 2009-021007

(51) Int. Cl.
*H01L 27/148* (2006.01)
(52) U.S. Cl. ................. 257/225; 257/E27.159
(58) Field of Classification Search .......... 257/225, 257/E27.159; 438/60
See application file for complete search history.

(56) References Cited

U.S. PATENT DOCUMENTS

| | | | |
|---|---|---|---|
| 5,250,825 A | 10/1993 | Negishi et al. | |
| 6,468,826 B1 | 10/2002 | Murakami et al. | |
| 6,995,349 B2* | 2/2006 | Suzuki | 250/214.1 |
| 7,233,037 B2* | 6/2007 | Nakahashi et al. | 257/291 |
| 7,348,614 B2 | 3/2008 | Kanbe | |
| 7,394,141 B2* | 7/2008 | Toyokawa et al. | 257/463 |
| 7,446,358 B2 | 11/2008 | Kanbe | |
| 7,534,644 B2 | 5/2009 | Kanbe | |
| 7,772,017 B2* | 8/2010 | Saito | 438/24 |
| 7,888,161 B2* | 2/2011 | Sato | 438/72 |
| 7,929,036 B2* | 4/2011 | Miyamoto et al. | 348/311 |
| 2003/0173582 A1* | 9/2003 | Hatano et al. | 257/184 |
| 2003/0197173 A1* | 10/2003 | Azumi | 257/21 |
| 2006/0022235 A1 | 2/2006 | Kanbe | |
| 2006/0220073 A1* | 10/2006 | Kooriyama | 257/257 |
| 2007/0034981 A1* | 2/2007 | Saito | 257/462 |
| 2007/0155042 A1 | 7/2007 | Kanbe | |
| 2007/0158676 A1 | 7/2007 | Kanbe | |
| 2007/0164334 A1 | 7/2007 | Kanbe | |
| 2008/0210983 A1 | 9/2008 | Yamada et al. | |
| 2008/0237652 A1* | 10/2008 | Azumi et al. | 257/231 |
| 2008/0251873 A1 | 10/2008 | Kasano et al. | |
| 2009/0014824 A1 | 1/2009 | Sakoh et al. | |
| 2009/0020840 A1 | 1/2009 | Toshikiyo et al. | |
| 2009/0090943 A1 | 4/2009 | Hirata et al. | |
| 2009/0250779 A1 | 10/2009 | Hirose et al. | |
| 2011/0175189 A1* | 7/2011 | Suzuki | 257/443 |

FOREIGN PATENT DOCUMENTS

| | | |
|---|---|---|
| JP | 4-279059 | 10/1992 |
| JP | 2006-41369 | 2/2006 |

* cited by examiner

*Primary Examiner* — Benjamin Sandvik
(74) *Attorney, Agent, or Firm* — Greenblum & Bernstein, P.L.C.

(57) ABSTRACT

A solid-state imaging device including: light-receiving units which are formed in rows and columns; a transfer channel formed in each column; first and second transfer electrodes that are formed in the same layer and deposited alternately above the transfer channel; insulating regions each formed above the transfer channel and between one of the first transfer electrodes and one of the second transfer electrodes which are adjacent to each other; an antireflection film formed above the light-receiving units, and formed on the insulating regions to cover the insulating regions; a first wire formed in each row in a layer upper than the antireflection film, and electrically connected to second transfer electrodes; and a light-shielding film which is formed in a layer upper than the first wire, covers the transfer channel, and has an opening above each of the light-receiving units.

9 Claims, 9 Drawing Sheets

Transfer direction

Y0-Y1 cross section

X0-X1 cross section

X2-X3 cross section

Transfer direction →

Y0-Y1 cross section

X0-X1 cross section

Y0-Y1 cross section

Transfer direction

Y0-Y1 cross section

X0-X1 cross section

Transfer direction →

Y0-Y1 cross section

X0-X1
cross section

X2-X3
cross section

Transfer direction

Y0-Y1 cross section

Transfer direction →

Y0-Y1 cross section

X2-X3 cross section

Transfer direction →

Y0-Y1 cross section

X0-X1 cross section

SOLID-STATE IMAGING DEVICE AND MANUFACTURING METHOD THEREOF

BACKGROUND OF THE INVENTION (1) Field of the Invention

The present invention relates to solid-state imaging devices and manufacturing methods thereof, and in particular to a solid-state imaging device including light-receiving units arranged in rows and columns and a vertical charge transfer unit which transfers signal charge obtained as a result of conversion by the light-receiving units.

(2) Description of the Related Art

Solid-state imaging devices represented by charge-coupled device (CCD) image sensors are widely used as imaging elements of imaging apparatuses such as digital still cameras and digital video cameras, and are in increasing demand. With the recent shift to the high-definition television, imaging apparatuses are now required to handle high-definition videos. This means that higher transfer frequency is required of solid-state imaging devices.

As a technique to enable the higher transfer frequency, that is, high-speed transfer, it is known to connect shunt wires and transfer electrodes in a vertical charge transfer unit via vertically extending light-shielding films (refer to Patent Reference 1: Japanese Unexamined Patent Application Publication No. 04-279059, for example).

However, vertical deposition of shunt wires as shown in Patent Reference 1 does not mean that voltages of the same level are applied simultaneously to all the light-shielding films connected to the shunt wires. As a result, voltages of different levels are applied to adjacent light-shielding films.

The light-shielding films are deposited for each of columns of vertically arranged pixels. This creates a difference, between adjacent columns of pixels, in level of voltages applied between the light-shielding films and the upper-side interface of the semiconductor substrate. As a result, the solid-state imaging device of Patent Reference 1 has a difference, between the adjacent columns of pixels, also in amount of charge captured and lost in the interface state of the semiconductor substrate while the charge is read out from the light-receiving units to the vertical charge transfer unit.

Due to these differences, the conventional solid-state imaging device has a problem of unevenness in the output.

To solve this problem, a technique of horizontally forming shunt wires is known (refer to Patent Reference 2: Japanese Unexamined Patent Application Publication No. 2006-41369, for example).

Hereinafter, a conventional solid-state imaging device of Patent Reference 2 is described with reference to FIGS. 7A to 7C.

FIG. 7A is a plan view of light-receiving units 111 and vertical charge transfer units 113 of a conventional solid-state imaging device 100. FIG. 7B is a cross-sectional view showing the Y0-Y1 plane of FIG. 7A. FIG. 7C is a cross-sectional view showing the X0-X1 plane of FIG. 7A.

The conventional solid-state imaging device 100 includes a plurality of light-receiving units 111 arranged in rows and columns and a plurality of vertical charge transfer units 113 provided for each column. Each of the vertical charge transfer units 113 transfers, in the vertical direction (the column direction), signal charge obtained as a result of photoelectric conversion by the light-receiving units 111 arranged in a corresponding column, and then outputs the signal charge to a horizontal charge transfer unit (not shown). It is to be noted that the lateral direction of FIG. 7A is referred to as the vertical direction and the longitudinal direction of FIG. 7A is referred to as the horizontal direction.

Each of the vertical charge transfer units 113 includes a transfer channel 112, insulating films 102, 105, and 108, a plurality of first transfer electrodes 103a, a plurality of second transfer electrodes 103b, insulating regions 104, shunt wires 107a and 107b, a light-shielding film 109, and contacts 110a and 110b.

The transfer channel 112 extends vertically, and is horizontally coupled to the light-receiving units 111 arranged in the corresponding column.

The first transfer electrodes 103a and the second transfer electrodes 103b are formed in the same layer, and are deposited above the transfer channel 112. One first transfer electrode 103a and one second transfer electrode 103b are deposited for each light-receiving unit 111. The first transfer electrodes 103a and the second transfer electrodes 103b are deposited alternately in the vertical direction.

Each of the insulating regions 104 is formed between one first transfer electrode 103a and one second transfer electrode 103b above the transfer channel 112 to insulate the first transfer electrode 103a and the second transfer electrode 103a. The width of each insulating region 104 is between 0.05 μm and 0.15 μm inclusive approximately, to prevent transfer troubles.

The shunt wires 107a and 107b are formed above the first transfer electrodes 103a and the second transfer electrodes 103b. The shunt wires 107a correspond one-to-one with the first transfer electrodes 103a, whereas the shunt wires 107b correspond one-to-one with the second transfer electrodes 103b. The shunt wires 107a are electrically connected to the first transfer electrodes 103a via the contacts 110a. The shunt wires 107b are electrically connected to the second transfer electrodes 103b via the contacts 110b. The shunt wires 107a and 107b have resistance lower than that of the first transfer electrodes 103a and the second transfer electrodes 103b. For example, the shunt wires 107a and 107b are made of a metal such as tungsten, whereas the first transfer electrodes 103a and the second transfer electrodes 103b are made of polysilicon.

The insulating film 105 is formed between the shunt wires 107a and 107b and the first transfer electrodes 103a and the second transfer electrodes 103b.

The insulating film 108 is formed over the shunt wires 107a and 107b.

The light-shielding film 109 is formed on the insulating film 108. The light-shielding film 109 has an opening 114 above each of the light-receiving units 111.

Here, in the case of arranging pixels of about 2 μm square, the width W1 of a section of the first transfer electrodes 103a extending horizontally between the light-receiving units 111 is 0.45 μm approximately. Further, the total number of shunt wires 107a and 107b deposited in each row is equal to the number of transfer electrodes deposited for one light-receiving unit 111, which is two in this example. The width W2 of the shunt wires 107a and 107b is 0.12 μm, for example, and the space W3 between each shunt wire 107a and an adjacent shunt wire 107b is 0.16 μm, for example.

Next, a method for manufacturing the conventional solid-state imaging device 100 is described.

First, as shown in FIGS. 7B and 7C, the insulating film 102 is formed on the surface of a semiconductor substrate 101 by a thermal oxidation method. Then, formation of various resist patterns and ion implantation are performed on the semiconductor substrate 101. By doing so, the light-receiving units 111 and the transfer channel 112 are formed.

Next, after forming a conductive film such as a polysilicon film, the conductive film on the transfer channel is divided to form the first transfer electrodes 103a and the second transfer electrodes 103b. Here, as described above, since the insulating regions 104 need to be formed with widths between 0.05 μm and 0.15 μm inclusive approximately, the insulating film 105, which is to be used as a hard mask, is generally first deposited on the conductive film using a method such as CVD.

To be more specific, after forming the insulating film 105 on the entire surface, a resist pattern having widths between 0.15 μm and 0.30 μm inclusive approximately is formed on the insulating film 105 using a photolithographic method. Next, grooves are formed on the insulating film 105 using anisotropic etching using the resist pattern. Then, an oxide film of 0.05 μm to 0.10 μm in thickness is deposited on the side surfaces of the grooves using a method such as CVD so as to form side walls on the side surfaces of the grooves. By doing so, the grooves are narrowed to a desired width.

Next, the anisotropic etching is performed using, as a hard mask, the insulating film 105 having the grooves, so that grooves which vertically divide the conductive film are formed.

Next, the conductive film in a region other than the transfer channel 112 is etched using the photolithographic method, so that the first transfer electrodes 103a and the second transfer electrodes 103b are formed.

Next, film formation using a method such as CVD forms the insulating regions 104 to fill the isolate regions (grooves) between the first transfer electrodes 103a and the second transfer electrodes 103b above the transfer channel 112.

Next, the contacts 110a and 110b are formed to penetrate the insulating film 105. Next, a conductive film is formed to entirely cover the upper surface of the semiconductor substrate 101, including over the first transfer electrodes 103a and the second transfer electrodes 103b. Specifically, for example, a thin metal film made of tungsten or the like is formed using a method such as CVD or sputtering.

Next, the anisotropic etching is performed on the thin metal film using the photolithographic method, so that the shunt wires 107a and 107b are formed. Here, to allow the space W3 between each shunt wire 107a and the adjacent shunt wire 107b to be 0.16 μm approximately, the etching is performed at a low selective ratio to make dimensional loss small.

Next, the insulating film 108 is deposited by a method such as CVD. Subsequently, a light-shielding metal film is deposited on the insulating film 108 and is then etched using the photolithographic method, so that the light-shielding film 109 is formed.

The above processing makes the structure shown in FIGS. 7A to 7C.

After that, lens elements are so on are formed if necessary (not shown).

With the above structure of the conventional solid-state imaging device 100, the shunt wires 107a and 107b are not electrically connected with the light-shielding film 109, thereby allowing the levels of voltages applied between the light-shielding film 109 and the upper-side interface of the semiconductor substrate 101 to be uniform among the pixel columns. As a result, the solid-state imaging device 100 can reduce the unevenness in the output.

SUMMARY OF THE INVENTION

With the solid-state imaging device 100, however, the insulating regions 104 between the first transfer electrodes 103a and the second transfer electrodes 103b are formed using the hard mask having the processed side walls, and thus there is an open area above the hard mask as shown in FIG. 7B. Performing the etching in this state for forming the shunt wires 107a and 107b results in cutting the insulating regions 104. Further, since this etching is performed at a low selective ratio to suppress dimensional loss as described above, the insulating regions 104 are largely cut (0.1 μm, for example).

More specifically, the insulating regions 104 in areas 120a and 120b shown in FIGS. 7A and 7B are cut as shown in FIG. 7B. This causes reduction in the distance between the light-shielding film 109 formed above the insulating regions 104 and the first transfer electrodes 103b and the second transfer electrodes 103b as shown in FIG. 7B, thereby decreasing the dielectric strength between the light-shielding film 109 and the first transfer electrodes 103b and the second transfer electrodes 103b.

To avoid such a decrease in the dielectric strength, one could consider thickly depositing the insulating film 108 (0.2 μm, for example). Thickening the insulating film 108, however, causes an increase in the distance between the light-shielding film 109 and the interface of the semiconductor substrate 101. Further, thickening the insulating film 108 decreases the width of the opening 114 by twice the thickness of the insulating film 108. These changes cause another problem of deterioration in the sensitivity and the smear characteristics of the solid-state imaging device 100.

To avoid largely cutting the insulating regions 104 at the time of the etching for forming the shunt wires 107a and 107b, one could also consider increasing the selective ratio used for the etching. Increasing the selective ratio, however, causes a greater dimensional loss at the time of etching (0.1 μm, for example), making the space W3 between each shunt wire 107a and the adjacent shunt wire 107b as wide as 0.36 μm approximately, for example. This causes reduction in the vertical width of the opening 114, resulting in a problem of deterioration in the sensitivity and the smear characteristics of the solid-state imaging device 100.

The present invention is to solve the above problems, and is to achieve an object of providing a solid-state imaging device capable of suppressing the deterioration in the sensitivity and the smear characteristics, and a method for manufacturing the solid-state imaging device.

In order to achieve the above object, the solid-state imaging device according to an aspect of the present invention is a solid-state imaging device including: a semiconductor substrate; a plurality of light-receiving units which are formed in rows and columns on the semiconductor substrate and convert incident light into signal charge; a transfer channel formed in each of the columns for transferring, in a column direction, the signal charge obtained as a result of the conversion by the plurality of light-receiving units in a corresponding one of the columns; a plurality of first transfer electrodes and a plurality of second transfer electrodes that are formed in a same layer and deposited alternately above the transfer channel in the column direction; insulating regions each of which is formed above the transfer channel and between one of the plurality of first transfer electrodes and one of the plurality of second transfer electrodes which are adjacent to each other in the column direction; an antireflection film formed above the plurality of light-receiving units to prevent reflection of light entering the plurality of light-receiving units, and formed on the insulating regions to cover the insulating regions; a first wire formed in each of the rows in a layer upper than the antireflection film, and electrically connected to a plurality of second transfer electrodes, among the plurality of second transfer electrodes, which are deposited in a corresponding one of the rows; and a light-shielding film which is formed in a layer upper than the first wire, covers the transfer channel, and has an opening above each of the plurality of light-receiving units.

According to this structure, the solid-state imaging device according to an aspect of the present invention has the antireflection film on each of the insulating regions. This prevents cutting the insulating regions at the time of the etching for forming the first wire. Thus, the solid-state imaging device according to an aspect of the present invention does not need to thicken the insulating film between the light-shielding film and the first and second transfer electrodes in order to secure the dielectric strength between the light-shielding film and the first and second transfer electrodes. As a result, the solid-state imaging device according to an aspect of the present invention can shorten the distance between the light-shielding film and the interface of the semiconductor substrate, and increase the width of openings of the light-shielding film. This allows the solid-state imaging device according to an aspect of the present invention to suppress deterioration in the sensitivity and the smear characteristics.

In addition, even when the selective ratio for the etching that is performed for forming the first wire is reduced, the solid-state imaging device according to an aspect of the present invention can prevent the etching from cutting the insulating regions. This enables the etching to be performed under a condition that suppresses the dimensional loss to the fullest extent. As a result, the width of the first wire can be increased, making faster transfer possible.

Further, the solid-state imaging device may further include: a second wire formed in each of the rows in a layer upper than the antireflection film, and formed above a plurality of first transfer electrodes, among the plurality of first transfer electrodes, which are deposited in a corresponding one of the rows, the second wire being electrically connected to the plurality of first transfer electrodes deposited in the corresponding one of the rows, wherein the antireflection film may be formed at least in part of a region above the plurality of first transfer electrodes and under the second wire.

According to this structure, the solid-state imaging device according to an aspect of the present invention can enlarge the pattern of the antireflection film. This makes it possible to easily manufacture the antireflection film at high precision. Moreover, enlarging the pattern of the antireflection film increases the flatness.

Furthermore, the solid-state imaging device may further include a plurality of contacts each of which electrically connects the second wire and one of the plurality of first transfer electrodes which is deposited in one of the rows corresponding to the second wire, wherein the antireflection film may be formed to cover the plurality of first transfer electrodes except regions of the plurality of contacts.

According to this structure, the solid-state imaging device according to an aspect of the present invention can enlarge the pattern of the antireflection film. This makes it possible to easily manufacture the antireflection film at high precision. Moreover, enlarging the pattern of the antireflection film increases the flatness.

Moreover, it may be that a part of the antireflection film formed above one of the plurality of light-receiving units is deposited in the opening, and horizontal ends of the part of the antireflection film formed above the one of the plurality of light-receiving units do not reach regions under the light-shielding film.

According to this structure, the solid-state imaging device according to an aspect of the present invention does not have the antireflection film between the ends of the light-shielding film and the semiconductor substrate, on the side surfaces of the first and second transfer electrodes. This makes the thickness of a film between the ends of the light-shielding film and the semiconductor substrate thinner. As a result, the solid-state imaging device according to an aspect of the present invention can suppress oblique incident light entering through the region between the ends of the light-shielding film and the semiconductor substrate. This allows the solid-state imaging device according to an aspect of the present invention to achieve low smear.

Further, it may be that a part of the antireflection film formed on one of the insulating regions to cover the one of the insulating regions covers a part of a region above one of the plurality of first transfer electrodes adjacent to the one of the insulating regions and a part of a region above one of the plurality of second transfer electrodes adjacent to the one of the insulating regions, horizontal ends of the part of the antireflection film formed above the one of the plurality of first transfer electrodes do not reach side surfaces of the one of the plurality of first transfer electrodes, and horizontal ends of the part of the antireflection film formed above the one of the plurality of second transfer electrodes do not reach side surfaces of the one of the plurality of second transfer electrodes.

According to this structure, the solid-state imaging device according to an aspect of the present invention does not have the antireflection film between the side surfaces of the first and second transfer electrodes and the light-shielding film covering these side surfaces. As a result, the solid-state imaging device according to an aspect of the present invention can increase the width of the openings, thereby achieving higher sensitivity.

Furthermore, the antireflection film may be made of silicon nitride.

The method for manufacturing a solid-state imaging device according to another aspect of the present invention is a method for manufacturing a solid-state imaging device, the method including: forming, in rows and columns on a semiconductor substrate, a plurality of light-receiving units which convert incident light into signal charge; forming a transfer channel in each of the columns for transferring, in a column direction, the signal charge obtained as a result of the conversion by the plurality of light-receiving units in a corresponding one of the columns; forming, in a same layer, a plurality of first transfer electrodes and a plurality of second transfer electrodes which alternate above the transfer channel in the column direction; forming each of insulating regions above the transfer channel and between one of the plurality of first transfer electrodes and one of the plurality of second transfer electrodes which are adjacent to each other in the column direction; forming an antireflection film above the plurality of light-receiving units to prevent reflection of light entering the plurality of light-receiving units and on the insulating regions to cover the insulating regions; forming a first wire in each of the rows in a layer upper than the antireflection film, the first wire being electrically connected to a plurality of second transfer electrodes, among the plurality of second transfer electrodes, which are deposited in a corresponding one of the rows; and forming a light-shielding film in a layer upper than the first wire and the antireflection film, the light-shielding film covering the transfer channel and having an opening above each of the plurality of light-receiving units.

According to this method, the solid-state imaging device according to an aspect of the present invention has the antireflection film on each of the insulating regions. This prevents cutting the insulating regions at the time of the etching for forming the first wire. Thus, the solid-state imaging device according to an aspect of the present invention does not need to thicken the insulating film between the light-shielding film and the first and second transfer electrodes in order to secure the dielectric strength between the light-shielding film and the first and second transfer electrodes. As a result, the solid-state imaging device according to an aspect of the present invention can shorten the distance between the light-shielding film and the interface of the semiconductor substrate, and increase the width of openings of the light-shielding film. Thus, the method for manufacturing the solid-state imaging device according to an embodiment of the present invention enables manufacturing of a solid-state imaging device capable of suppressing the deterioration in the sensitivity and the smear characteristics.

In addition, even when the selective ratio for the etching that is performed to form the first wire is reduced, the solid-state imaging device according to an aspect of the present invention can prevent the etching from cutting the insulating regions. This enables the etching to be performed under a condition that suppresses the dimensional loss to the fullest extent. As a result, according to the method for manufacturing the solid-state imaging device according to an aspect of the present invention, the width of the first wire can be increased, and thus it is possible to manufacture a solid-state imaging device which can achieve faster transfer.

Further, in the forming of a first wire, the first wire may be formed by forming a first conductive film and then etching the first conductive film.

Furthermore, the forming of a plurality of first transfer electrodes and a plurality of second transfer electrodes may include: forming a second conductive film; forming an insulating film on the second conductive film; forming a first insulating film pattern by etching the insulating film; forming a second insulating film pattern by forming a side wall on a side surface of the first insulating film pattern, the second insulating film pattern including the first insulating film pattern and the side wall; and forming the plurality of first transfer electrodes and the plurality of second transfer electrodes by etching the second conductive film using the second insulating film pattern as a mask.

It is to be noted that the present invention can be realized as a semiconductor integrated circuit (Large-Scale Integration) which partially or entirely implements the functions of such a solid-state imaging device as above, and as a digital still camera or a digital video camera having such a solid-state imaging device.

According to what is described above, the present invention provides a solid-state imaging device capable of suppressing the deterioration in the sensitivity and the smear characteristics, and a method for manufacturing the solid-state imaging device.

FURTHER INFORMATION ABOUT TECHNICAL BACKGROUND TO THIS APPLICATION

The disclosure of Japanese Patent Application No. 2009-021007 filed on Jan. 30, 2009 including specification, drawings and claims is incorporated herein by reference in its entirety.

BRIEF DESCRIPTION OF THE DRAWINGS

These and other objects, advantages and features of the invention will become apparent from the following description thereof taken in conjunction with the accompanying drawings that illustrate a specific embodiment of the invention. In the Drawings.

DESCRIPTION OF THE PREFERRED EMBODIMENT(S)

Hereinafter, a solid-state imaging device and a manufacturing method thereof according to embodiments of the present invention are described with reference to the drawings.

Embodiment 1

A solid-state imaging device according to Embodiment 1 of the present invention has an antireflection film on insulating regions formed between transfer electrodes. As a result, the solid-state imaging device according to Embodiment 1 of the present invention can prevent etching, which is performed for forming shunt wires, from cutting the insulating regions, thereby suppressing deterioration in the sensitivity and the smear characteristics.

Hereinafter, a solid-state imaging device 20 according to Embodiment 1 of the present invention is described with reference to FIGS. 1A to 1D. The solid-state imaging device 20 shown in FIGS. 1A to 1D is a CCD solid-state imaging device having a shunt wire structure.

Figure 1A:
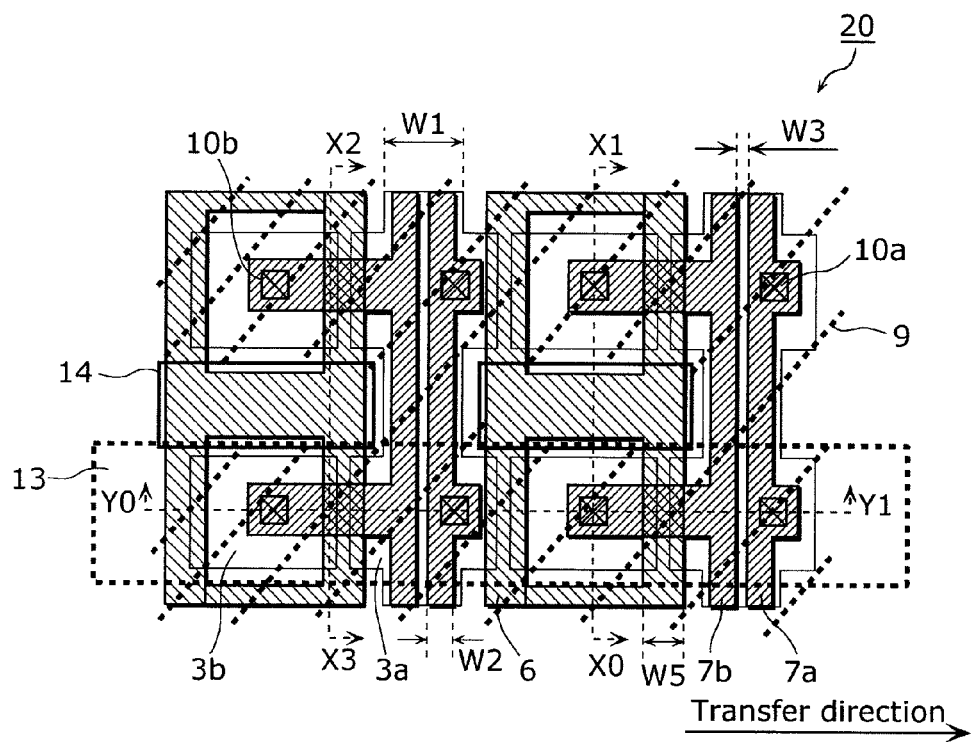
FIG. 1A is a plan view of a solid-state imaging device according to Embodiment 1 of the present invention.
Figure 1B:
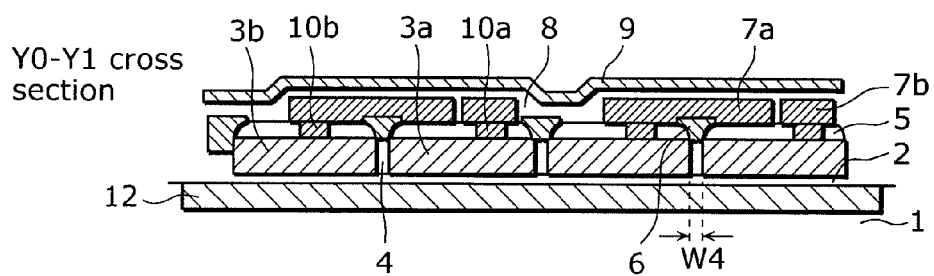
FIG. 1B is a cross-sectional view of a solid-state imaging device according to Embodiment 1 of the present invention taken along Y direction.
Figure 1C:
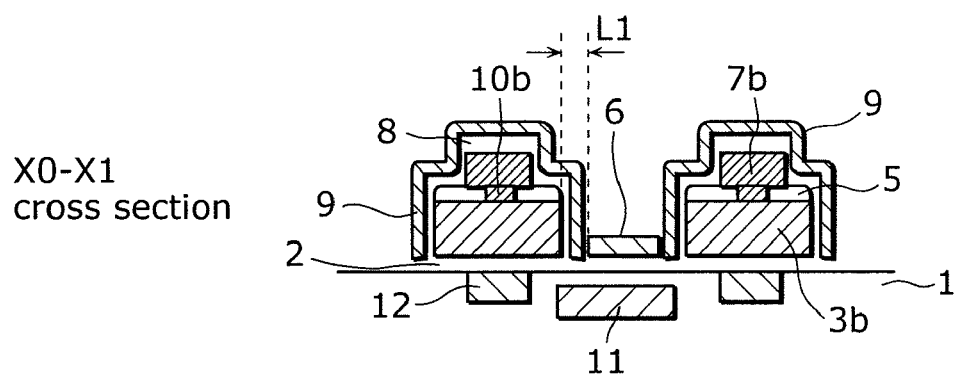
FIG. 1C is a cross-sectional view of a solid-state imaging device according to Embodiment 1 of the present invention taken along X direction.
Figure 1D:
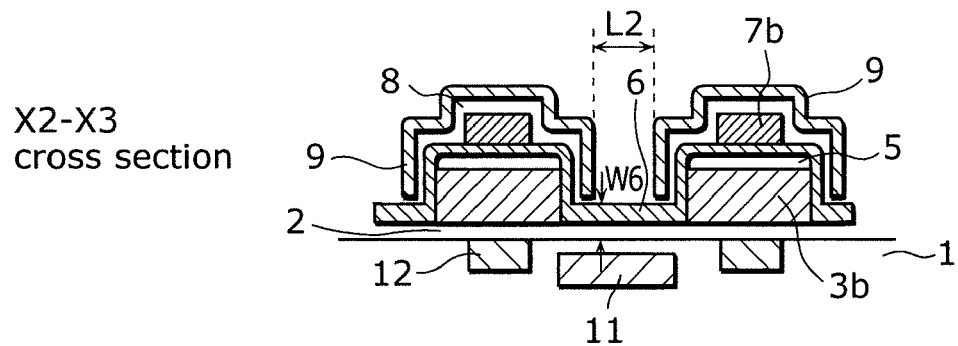
FIG. 1D is a cross-sectional view of a solid-state imaging device according to Embodiment 1 of the present invention taken along X direction.

FIG. 1A is a plan view showing a part of the solid-state imaging device 20 in close-up, and is specifically a plan view of light-receiving units 11 and vertical charge transfer units 13 of the solid-state imaging device 20. FIG. 1B is a cross-sectional view showing the Y0-Y1 plane of FIG. 1A. FIG. 1C is a cross-sectional view showing the X0-X1 plane of FIG. 1A. FIG. 1D is a cross-sectional view showing the X2-X3 plane of FIG. 1A.

The solid-state imaging device 20 includes a semiconductor substrate 1, a plurality of light-receiving units 11 arranged in rows and columns, and a plurality of vertical charge transfer units 13 provided for each column.

The semiconductor substrate 1 is an n-type silicon substrate, for example.

The light-receiving units 11 are deposited on the semiconductor substrate 1, and photoelectrically convert incident light into signal charge.

The vertical charge transfer units 13 are deposited on the semiconductor substrate 1. Each of the vertical charge transfer units 13 reads out the signal charge obtained as a result of the photoelectric conversion by the light-receiving units 11 arranged in a corresponding column, transfers the read-out signal charge in the vertical direction (the column direction), and then outputs the signal charge to a horizontal charge transfer unit (not shown). It is to be noted that the lateral direction of FIG. 1A is referred to as the vertical direction (column direction) and the longitudinal direction of FIG. 1A is referred to as the horizontal direction (row direction).

Each of the vertical charge transfer units 13 includes a transfer channel 12, an insulating film 2, a plurality of first transfer electrodes 3a, a plurality of second transfer electrodes 3b, insulating regions 4, insulating films 5 and 8, shunt wires 7a and 7b, a light-shielding film 9, and contacts 10a and 10b.

The transfer channel 12 is an n-type diffusion layer deposited on the upper-surface side of the semiconductor substrate 1. The transfer channel 12 extends vertically, and is horizontally coupled to the light-receiving units 11 arranged in the corresponding column. The transfer channel 12 is used for reading out the signal charge obtained as a result of the photoelectric conversion by the light-receiving units 11 arranged in the corresponding column, vertically transferring the read-out signal charge, and then outputting the signal charge to the horizontal charge transfer unit (not shown).

The insulating film 2 is a gate insulating film and is deposited to cover the upper-side interface of the semiconductor substrate 1 which includes the transfer channel 12. For example, the insulating film 2 is a silicon oxide film, and the thickness thereof is preferably between 10 and 100 nm inclusive, and more preferably 25 nm approximately.

The first transfer electrodes 3a and the second transfer electrodes 3b are formed in the same layer. Further, the first transfer electrodes 3a and the second transfer electrodes 3b are formed above the transfer channel 12 via the insulating film 2. The first transfer electrodes 3a and the second transfer electrodes 3b are made of polysilicon, for example. The thickness of the first transfer electrodes 3a and the second transfer electrodes 3b is preferably between 0.1 and 0.3 µm inclusive, and more preferably 0.2 µm approximately.

Further, the first transfer electrodes 3a and the second transfer electrodes 3b are formed such that they cross the transfer channel 12.

One first transfer electrode 3a and one second transfer electrode 3b are deposited for each light-receiving unit 11. Further, the first transfer electrodes 3a and the second transfer electrodes 3b are formed alternately above the transfer channel 12 in the vertical direction.

The first transfer electrodes 3a deposited in the same row are horizontally coupled, via polysilicon layers, to other first transfer electrodes 3a of another vertical charge transfer unit 13 adjacent in the horizontal direction (row direction). The wires connecting the first transfer electrodes 3a with each other are formed between vertically adjacent light-receiving units 11 so that the wires do not overlap the light-receiving units 11. For example, the width W1 of each wire connecting the first transfer electrodes 3a with each other is preferably between 0.3 and 0.5 µm inclusive, and more preferably 0.45 µm approximately.

The second transfer electrodes 3b are deposited in horizontal isolation with each other.

Each of the insulating regions 4 is formed above the transfer channel 12 and between one first transfer electrode 3a and one second transfer electrode 3b vertically adjacent to each other, so as to isolate the first transfer electrode 3a and the second transfer electrode 3b from each other. The width W4 of each insulating region 4 is between 0.05 µm and 0.15 µm inclusive approximately, to prevent transfer troubles. The insulating regions 4 are made of silicon oxide, for example.

The insulating film 5 is formed on the first transfer electrodes 3a and the second transfer electrodes 3b. For example, the insulating film 5 is a silicon oxide film, and the thickness thereof is preferably between 0.05 to 0.2 µm inclusive, and more preferably 0.1 µm approximately.

The antireflection film 6 is formed on the insulating film 2 above the light-receiving units 11 to prevent reflection of light entering the light-receiving units 11. The antireflection film 6 is made of a material having a refractive index higher than that of the insulating film 2, and is made of silicon nitride, for example. Further, the antireflection film 6 is deposited on the insulating regions 4 formed between the first transfer electrodes 3a and the second transfer electrodes 3b, so as to cover the insulating regions 4. The antireflection film 6 covers parts of the insulating film 5 so as to fill each groove between the insulating film 5 formed on the first transfer electrodes 3a and the insulating film 5 formed on the vertically adjacent second transfer electrodes 3b. The width W5 (vertical length) of the antireflection film 6 covering the insulating regions 4 is preferably between 0.1 and 0.5 µm inclusive, and more preferably 0.3 µm approximately. The thickness of the antireflection film 6 is preferably between 30 to 100 nm, and more preferably 50 nm approximately.

As shown in FIG. 1C, the distance L1 between a horizontal end of the antireflection film 6 above the light-receiving unit 11 and an end of the second transfer electrode 3b is set to lengths between 0.15 and 0.30 μm inclusive, for example. This allows shortening the distance between the light-shielding film 9 and the interface of the semiconductor substrate 1 and increasing the width of the opening 14. As a result, the solid-state imaging device 20 can achieve higher sensitivity and lower smear.

Here, a high refractive index film (silicon nitride film) made of the same material (silicon nitride) by the same process as the antireflection film 6 formed above the light-receiving units 11 is referred to as the antireflection film 6. It is to be noted that the components other than the antireflection film 6 formed above the light-receiving units 11 do not necessarily have the function of preventing the reflection of light entering the light-receiving units 11.

The shunt wires 7a and 7b are deposited on the insulating film and the antireflection film 6. Further, the shunt wires 7a correspond one-to-one with the first transfer electrodes 3a deposited in each column, whereas the shunt wires 7b correspond one-to-one with the second transfer electrodes 3b deposited in each column. The shunt wires 7a and 7b are formed in each row to extend horizontally. Each of the shunt wires 7a is electrically connected, via corresponding contacts 10a, to the first transfer electrodes 3a deposited in a corresponding row. Each of the shunt wires 7b is electrically connected, via corresponding contacts 10b, to the second transfer electrodes 3b deposited in a corresponding row. The shunt wires 7a and 7b have resistance lower than that of the first transfer electrodes 3a and the second transfer electrodes 3b. For example, the shunt wires 7a and 7b are made of a metal such as tungsten.

Further, the shunt wires 7a and 7b are formed above the first transfer electrodes 3a and extend above the first transfer electrodes 3a.

The total number of shunt wires 7a and 7b deposited in each row is equal to the number of transfer electrodes deposited for one light-receiving unit 11, which is two in this example. The width W2 of the shunt wires 7a and 7b is preferably between 0.08 and 0.15 μm inclusive, and more preferably 0.12 μm approximately. The space W3 between each shunt wire 7a and the adjacent shunt wire 7b is preferably between 0.10 and 0.20 μm inclusive, and more preferably 0.16 μm approximately. Further, the thickness of the shunt wires 7a and 7b is between 60 nm and 120 nm inclusive, for example.

The insulating film 8 is formed over the shunt wires 7a and 7b. The insulating film 8 is a silicon oxide film, for example.

The light-shielding film 9 is formed on the insulating film 8. Further, the light-shielding film 9 has the opening 14 above each of the light-receiving units 11. The light-shielding film 9 is formed above the transfer channel 12 to cover the transfer channel 12, and prevents the incident light from entering the transfer channel 12 (the vertical charge transfer unit 13). For example, the light-shielding film 9 is made of a metal such as tungsten. The thickness of the light-shielding film 9 is preferably between 80 and 300 nm, and more preferably 100 nm approximately.

Figure 2A:
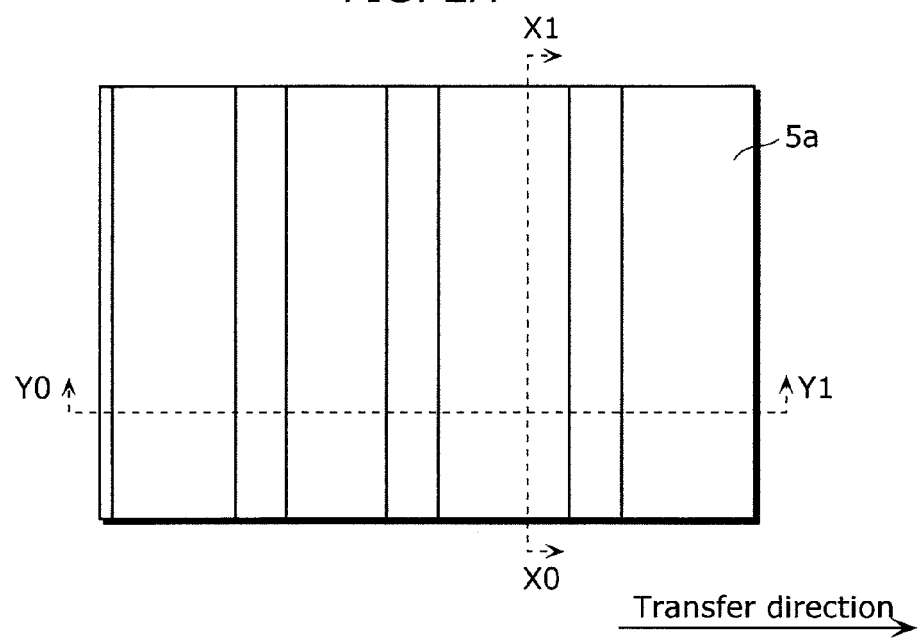
FIG. 2A is a plan view of a solid-state imaging device according to Embodiment 1 of the present invention in a manufacturing process.
Figure 2B:
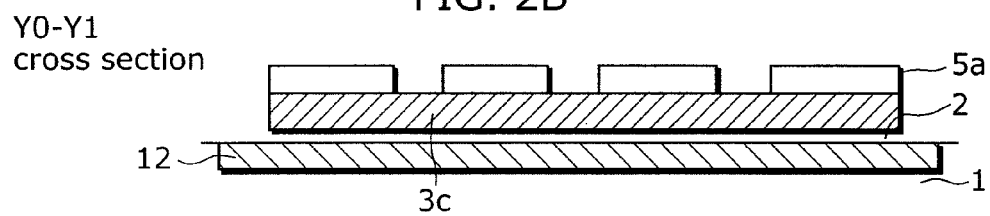
FIG. 2B is a cross-sectional view of a solid-state imaging device according to Embodiment 1 of the present invention in a manufacturing process, taken along Y direction.
Figure 2C:
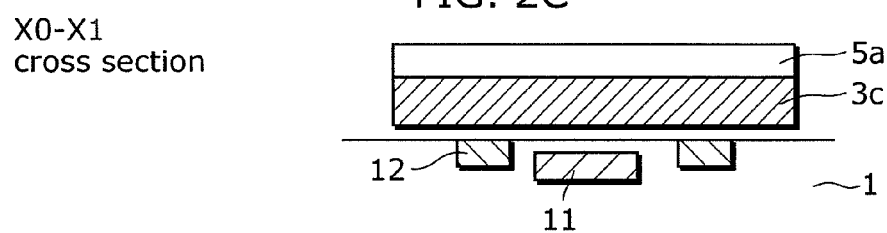
FIG. 2C is a cross-sectional view of a solid-state imaging device according to Embodiment 1 of the present invention in a manufacturing process, taken along X direction.
Figure 3A:
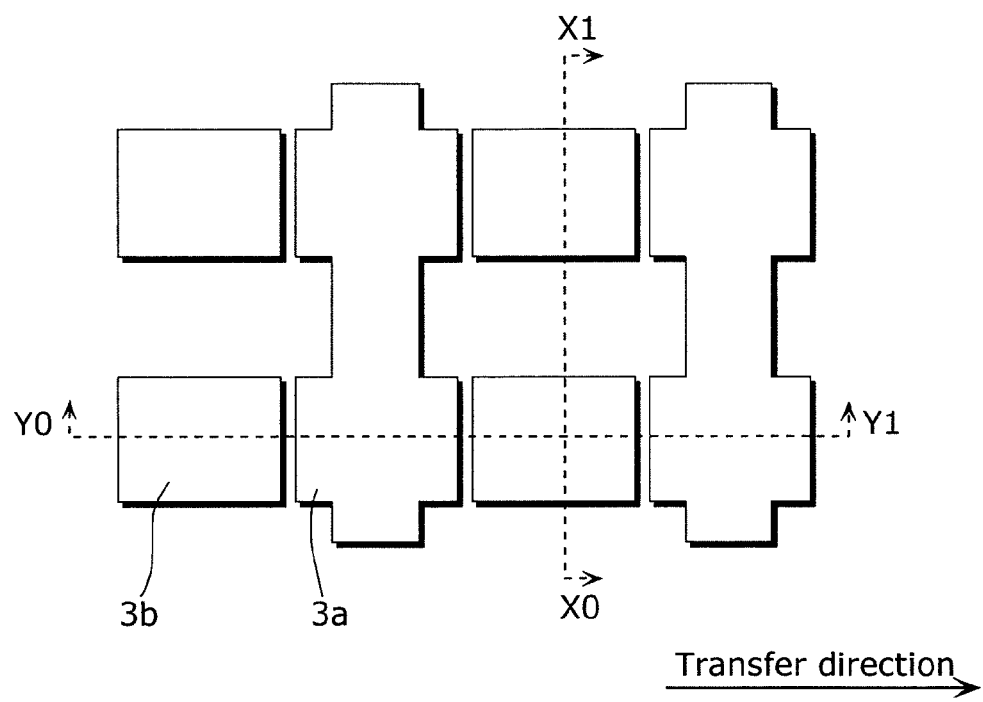
FIG. 3A is a plan view of a solid-state imaging device according to Embodiment 1 of the present invention in a manufacturing process.
Figure 3B:
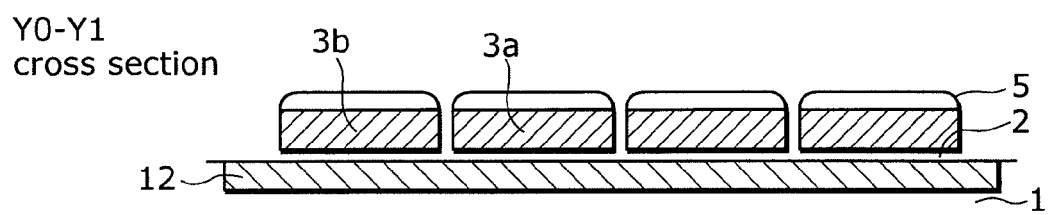
FIG. 3B is a cross-sectional view of a solid-state imaging device according to Embodiment 1 of the present invention in a manufacturing process, taken along Y direction.
Figure 3C:
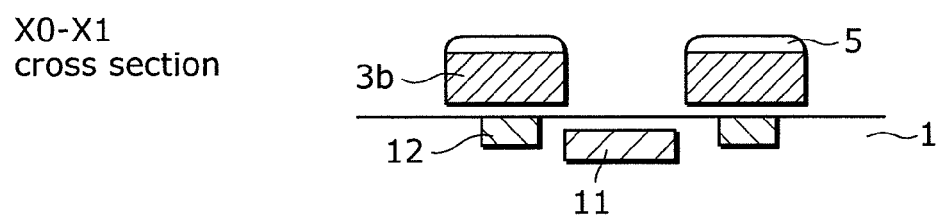
FIG. 3C is a cross-sectional view of a solid-state imaging device according to Embodiment 1 of the present invention in a manufacturing process, taken along X direction.
Figure 4A:
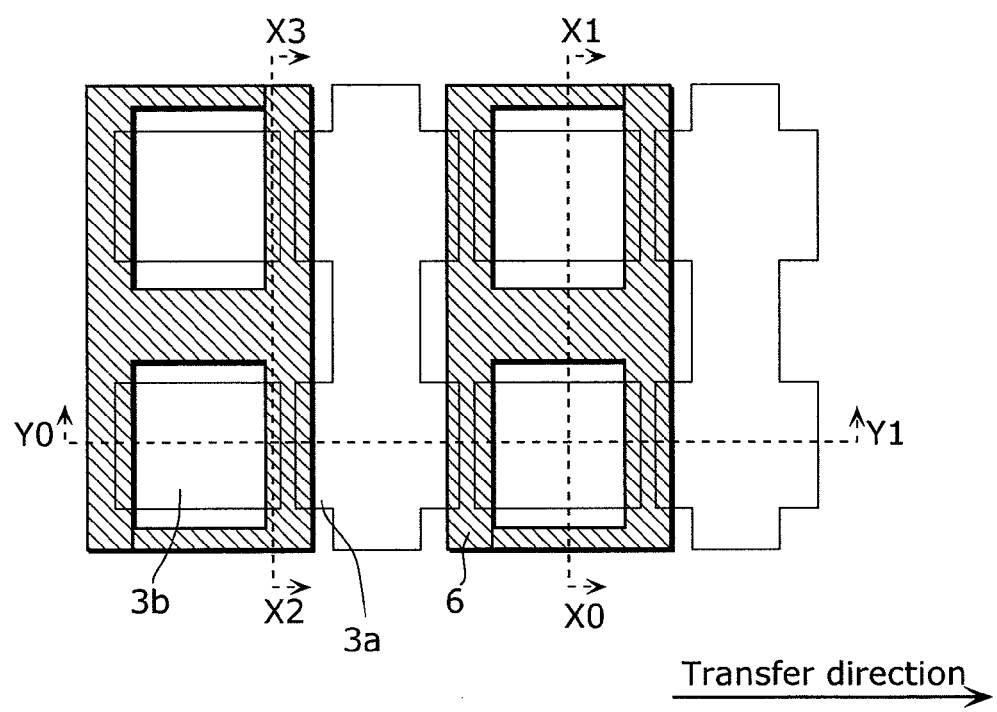
FIG. 4A is a plan view of a solid-state imaging device according to Embodiment 1 of the present invention in a manufacturing process.
Figure 4B:
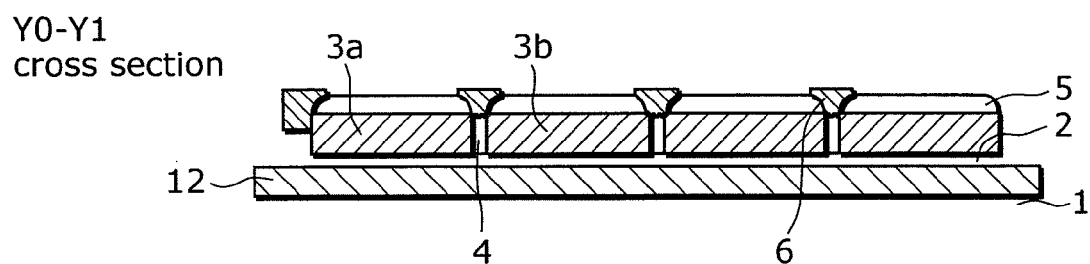
FIG. 4B is a cross-sectional view of a solid-state imaging device according to Embodiment 1 of the present invention in a manufacturing process, taken along Y direction.
Figure 4C:
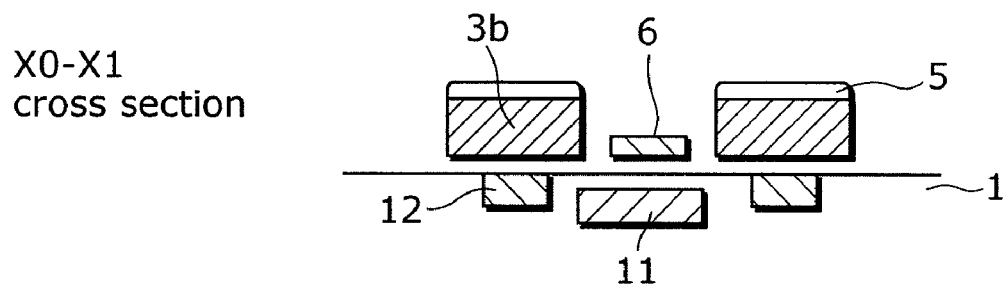
FIG. 4C is a cross-sectional view of a solid-state imaging device according to Embodiment 1 of the present invention in a manufacturing process, taken along X direction.
Figure 4D:
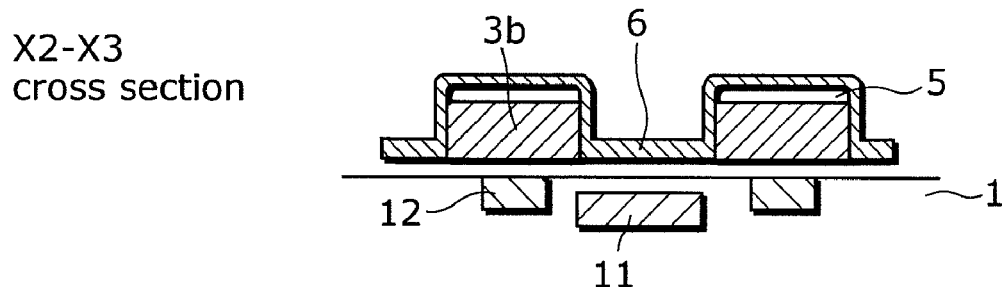
FIG. 4D is a cross-sectional view of a solid-state imaging device according to Embodiment 1 of the present invention in a manufacturing process, taken along X direction.

Next, the method for manufacturing the solid-state imaging device 20 according to Embodiment 1 of the present invention is described with reference to FIGS. 2A to 4D. FIGS. 2A to 4D show the structure of the solid-state imaging device 20 shown in FIGS. 1A to 1D in its manufacturing process. FIGS. 2A, 3A, and 4A are plan views of the solid-state imaging device 20 in its manufacturing process. FIG. 2B is a cross-sectional view showing the Y0-Y1 plane of FIG. 2A, and FIG. 2C is a cross-sectional view showing the X0-X1 plane of FIG. 2A. FIG. 3B is a cross-sectional view showing the Y0-Y1 plane of FIG. 3A, and FIG. 3C is a cross-sectional view showing the X0-X1 plane of FIG. 3A. FIG. 4B is a cross-sectional view showing the Y0-Y1 plane of FIG. 4A, FIG. 4C is a cross-sectional view showing the X0-X1 plane of FIG. 4A, and FIG. 4D is a cross-sectional view showing the X2-X3 plane of FIG. 4A.

First, as shown in FIGS. 2A to 2C, the insulating film 2 is formed on the surface of the semiconductor substrate 1 by a thermal oxidation method. Then, formation of various resist patterns and ion implantation are performed on the semiconductor substrate 1. By doing so, the light-receiving units 11 and the transfer channel 12 are formed.

Next, after forming a conductive film 3c such as a polysilicon film on the insulating film 2, the conductive film 3c is divided to form the first transfer electrodes 3a and the second transfer electrodes 3b.

As described above, in order to form the first transfer electrodes 3a and the second transfer electrodes 3b at intervals of 0.05 μm to 0.15 μm approximately, first, as shown in FIGS. 2B and 2C, an insulating film 5a, which is to be used as a hard mask, is deposited on the conductive film 3c using a method such as CVD.

Next, after forming a resist pattern having grooves 0.15 μm and 0.30 μm approximately in vertical width using a photolithographic method, anisotropic etching is performed using the resist pattern, so that the insulating film 5a has grooves. This makes the structure shown in FIGS. 2A to 2C.

Figure 2D:
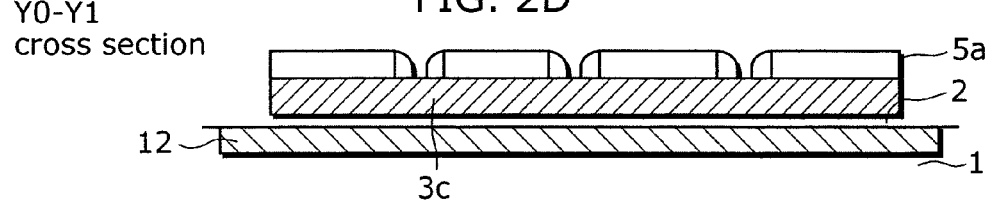
FIG. 2D is a cross-sectional view of a solid-state imaging device according to Embodiment 1 of the present invention in a manufacturing process, taken along Y direction.

Then, as shown in FIG. 2D, side walls that are insulating films of 0.05 μm to 0.10 μm in width are deposited on the side surfaces of the insulating film 5a using a method such as CVD. For example, the side walls are made of silicon oxide. With this, the grooves of the insulating film 5a can be narrowed to a desired width (0.05 μm to 0.15 μm). Next, the anisotropic etching is performed on the conductive film 3c using, as a hard mask, the insulating film 5a including the side walls, so that grooves which vertically divide the conductive film 3c are formed.

Next, the conductive film 3c in a region other than the transfer channel 12 is etched using the photolithographic method, so that the first transfer electrodes 3a and the second transfer electrodes 3b are formed. The above processing makes the structure shown in FIGS. 3A to 3C.

Next, by film formation using a method such as CVD, the grooves between the first transfer electrodes 3a and the second transfer electrodes 3b above the transfer channel 12 are filled. This forms the insulating regions 4.

Subsequently, after forming a nitride silicon film as the antireflection film 6 on the entire surface using a method such as CVD, the nitride silicon film is etched using the photolithographic method, so that the antireflection film 6 is formed to cover the upper surface of the insulating regions 4 and at least a part of the upper surface of the light-receiving units 11.

The above processing makes the structure shown in FIGS. 4A to 4D.

Next, the contacts 10a and 10b penetrating the insulating film 5 are formed on the insulating film 5 on the first transfer electrodes 3a and the second transfer electrodes 3b, respectively. Formed next is a thin metal film covering the entire upper surface of the semiconductor substrate 1, including over the first transfer electrodes 3a and the second transfer electrodes 3b. Specifically, for example, a thin metal film made of tungsten or the like is formed using a method such as CVD or sputtering.

Then, the anisotropic etching is performed on the conductive film using the photolithographic method, thereby forming the shunt wires 7a and 7b.

Here, to allow the space W3 between each shunt wire 7a and the adjacent shunt wire 7b to be 0.16 µm approximately, the etching for the formation of the shunt wires 7a and 7b is performed at a low selective ratio to make dimensional loss small.

Since the solid-state imaging device 20 according to Embodiment 1 of the present invention has the antireflection film 6 extending along the upper surface of the insulating regions 4 for the protection of the insulating regions 4, cutting the insulating regions 4 is prevented even when the etching is performed at a low selective ratio.

Next, the insulating film 8 is deposited by film formation using a method such as CVD. Then, a light-shielding metal film is deposited on the insulating film 8. Subsequently, the light-shielding metal film is etched using the photolithographic method, thereby forming the light-shielding film 9. The above processing makes the structure shown in FIGS. 1A to 1D.

After that, lens elements are so on are formed if necessary (not shown).

As shown above, the solid-state imaging device 20 according to Embodiment 1 of the present invention has the antireflection film 6 on the insulating regions 4. This prevents cutting the insulating regions 4 at the time of the etching for forming the shunt wires 7a and 7b. Thus, the solid-state imaging device 20 according to Embodiment 1 of the present invention does not need to thicken the insulating film 8 (0.2 µm, for example) in order to secure the dielectric strength between the light-shielding film 9 and the first transfer electrodes 3a and the second transfer electrodes 3b. Specifically, the thickness of the insulating film 8 can be 0.1 µm approximately, for example. As a result, the solid-state imaging device 20 according to Embodiment 1 of the present invention can shorten the distance between the light-shielding film 9 and the interface of the semiconductor substrate 1, and increase the width of the openings 14. Therefore, the solid-state imaging device 20 according to Embodiment 1 of the present invention can achieve higher sensitivity and lower smear.

In addition, even when the selective ratio of the etching performed for forming the shunt wires 7a and 7b is reduced, the solid-state imaging device 20 according to Embodiment 1 of the present invention can prevent the etching from cutting the insulating regions 4. This enables the etching to be performed under a condition that suppresses the dimensional loss to the fullest extent. As a result, the width of the shunt wires 7a and 7b can be increased, enabling the solid-state imaging device 20 to achieve fast transfer.

In addition, the solid-state imaging device 20 can increase the flatness by forming the antireflection film 6 on the insulating regions 4.

Embodiment 2

A solid-state imaging device 21 according to Embodiment 2 of the present invention is a variation of the solid-state imaging device 20 according to Embodiment 1, and has the antireflection film 6 in a region wider than in the solid-state imaging device 20 according to Embodiment 1.

Hereinafter, the solid-state imaging device 21 according to Embodiment 2 of the present invention is described with reference to FIGS. 5A and 5B.

Figure 5A:
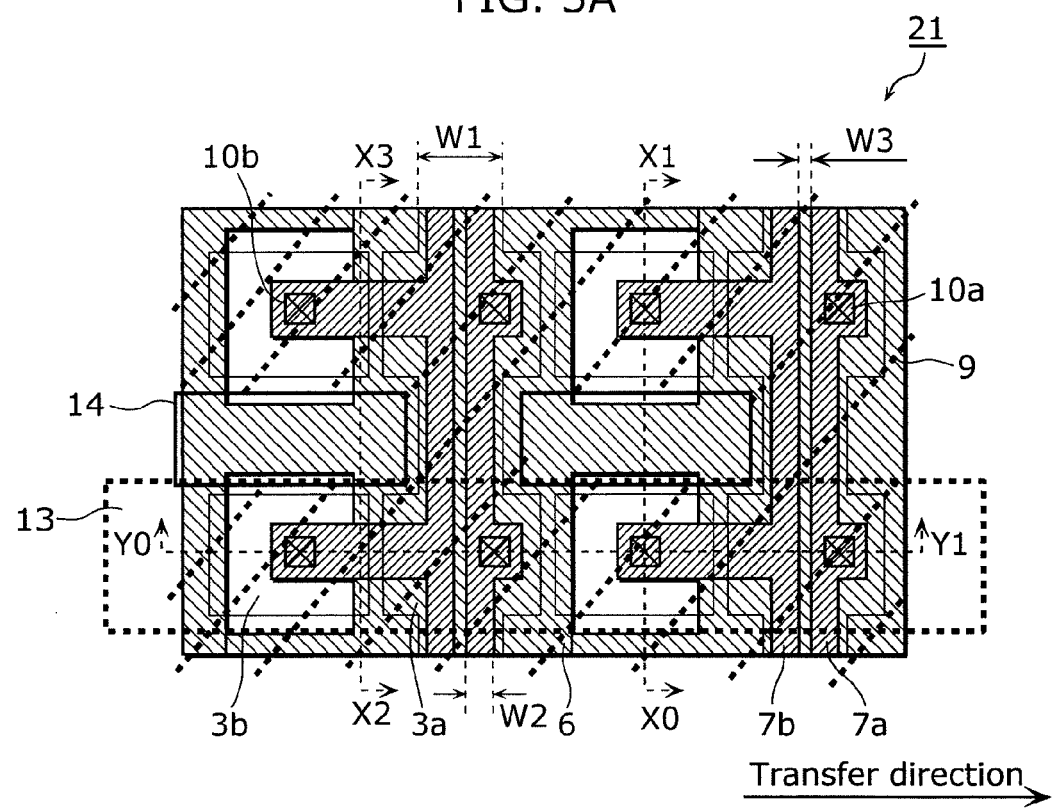
FIG. 5A is a plan view of a solid-state imaging device according to Embodiment 2 of the present invention.

FIG. 5A is a plan view showing a part of the solid-state imaging device 21 in close-up, and is specifically a plan view of the light-receiving units 11 and the vertical charge transfer units 13 of the solid-state imaging device 21. FIG. 5B is a cross-sectional view showing the Y0-Y1 plane of FIG. 5A. The cross-sectional views showing the X0-X1 plane and the X2-X3 plane of FIG. 5A are the same as FIGS. 1C and 1D.

The descriptions of the structural elements common to Embodiment 1 are omitted, and only the aspects different from Embodiment 1 are hereinafter described.

Figure 5B:
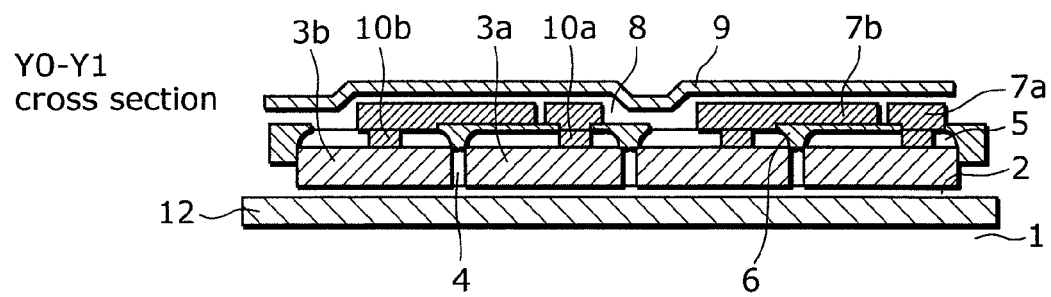
FIG. 5B is a cross-sectional view of a solid-state imaging device according to Embodiment 2 of the present invention taken along Y direction.

As shown in FIGS. 5A and 5B, the antireflection film 6 is formed also under the shunt wires 7a. Furthermore, the antireflection film 6 is formed also under the shunt wires 7b above the first transfer electrodes 3a. The antireflection film 6 is formed to cover the first transfer electrodes 3a except the regions of the contacts 10a.

The above structure allows the solid-state imaging device 21 according to Embodiment 2 of the present invention, as with the solid-state imaging device 20 according to Embodiment 1, to prevent the etching for forming the shunt wires 7a and 7b from cutting the insulating regions 4. As a result, as with the solid-state imaging device 20 according to Embodiment 1 of the present invention, the solid-state imaging device 21 according to Embodiment 2 can also achieve higher sensitivity, lower smear, and faster transfer.

In addition, the solid-state imaging device 21 according to Embodiment 2 of the present invention allows the antireflection film 6 to be manufactured more easily at higher precision because the pattern of the antireflection film 6 is larger than that of the solid-state imaging device 20 according to Embodiment 1. Moreover, the larger pattern of the antireflection film 6 leads to increased flatness.

The method for manufacturing the solid-state imaging device 21 is the same as in Embodiment 1, and thus the description thereof is omitted.

Embodiment 3

A solid-state imaging device 22 according to Embodiment 3 of the present invention is a variation of the solid-state imaging device 20 according to Embodiment 1, and has the antireflection film 6 in a region narrower than in the solid-state imaging device 20 according to Embodiment 1.

Hereinafter, the solid-state imaging device 22 according to Embodiment 3 of the present invention is described with reference to FIGS. 6A to 6C.

Figure 6A:
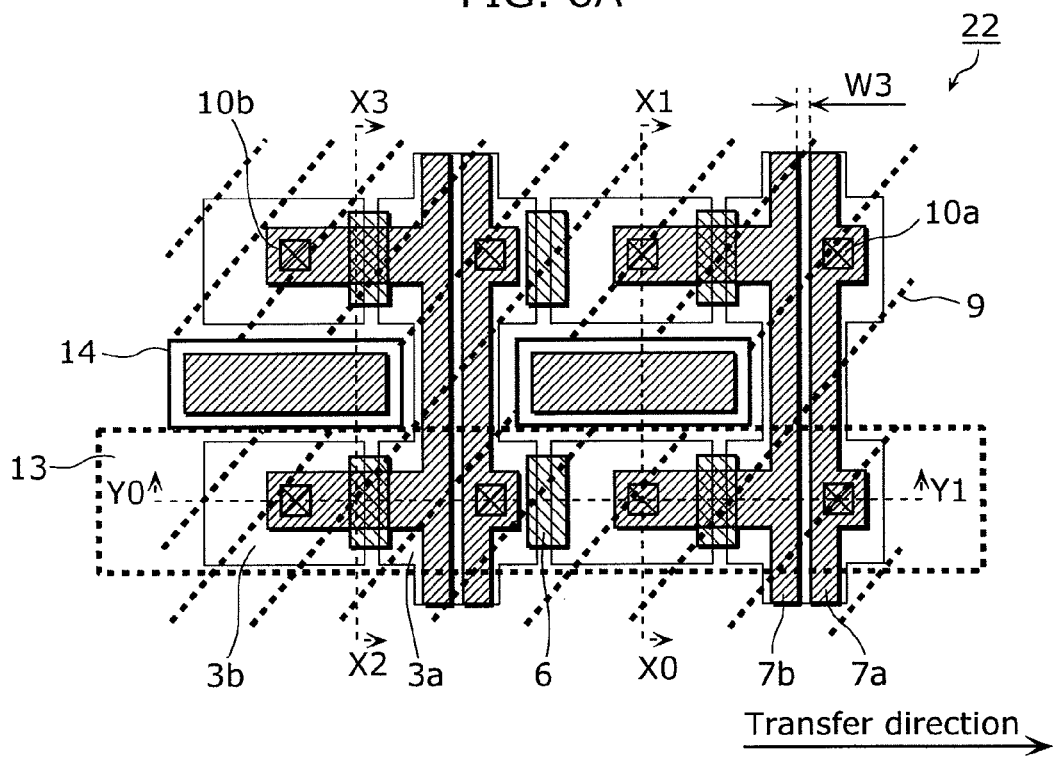
FIG. 6A is a plan view of a solid-state imaging device according to Embodiment 3 of the present invention.

FIG. 6A is a plan view showing a part of the solid-state imaging device 22 in close-up, and is specifically a plan view of the light-receiving units 11 and the vertical charge transfer units 13 of the solid-state imaging device 22. FIG. 6B is a cross-sectional view showing the Y0-Y1 plane of FIG. 6A. FIG. 6C is a cross-sectional view showing the X2-X3 plane of FIG. 6A. Further, the cross-sectional view showing the X0-X1 plane of FIG. 6A is the same as FIG. 1C.

The descriptions of the structural elements common to Embodiment 1 are omitted, and only the aspects different from Embodiment 1 are hereinafter described.

Figure 6B:
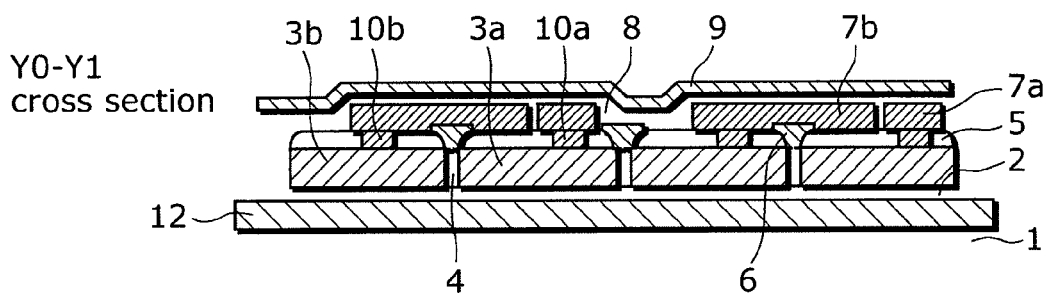
FIG. 6B is a cross-sectional view of a solid-state imaging device according to Embodiment 3 of the present invention taken along Y direction.
Figure 6C:
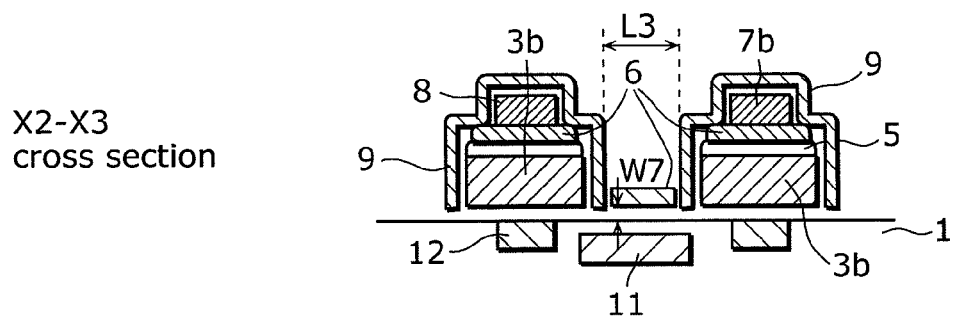
FIG. 6C is a cross-sectional view of a solid-state imaging device according to Embodiment 3 of the present invention taken along X direction.
Figure 7A:
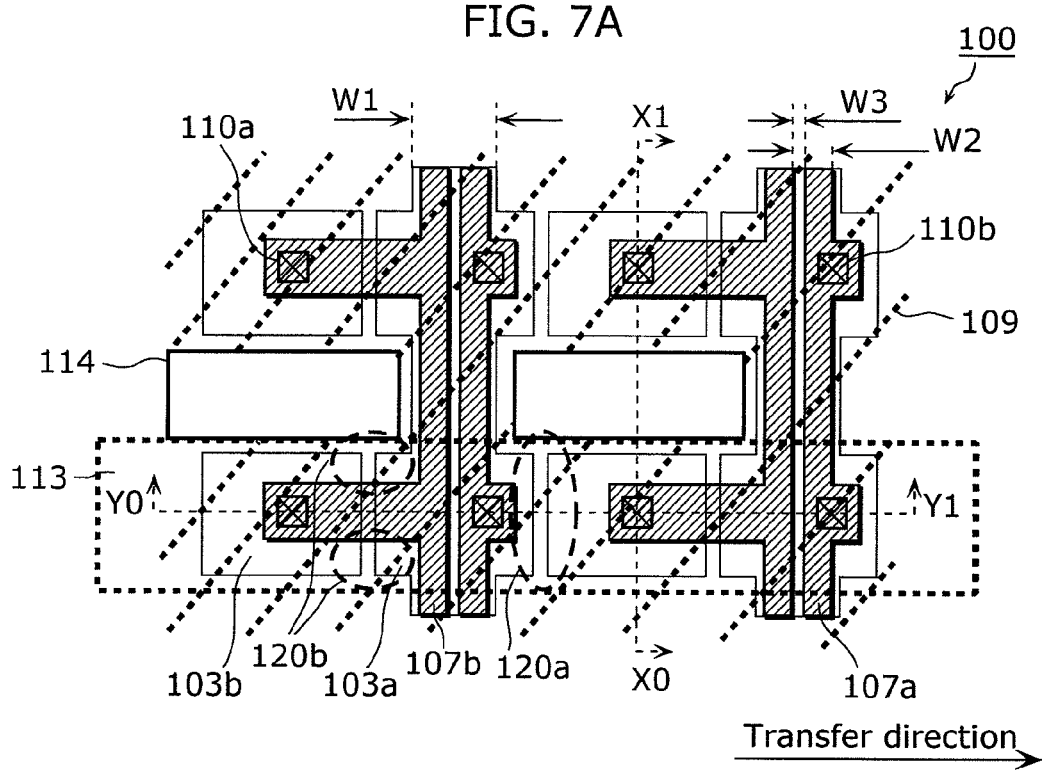
FIG. 7A is a plan view of a conventional solid-state imaging device.
Figure 7B:
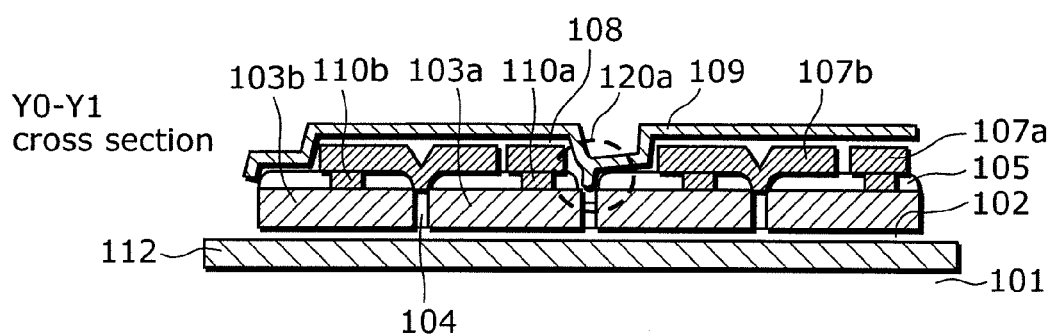
FIG. 7B is a cross-sectional view of a conventional solid-state imaging device taken along Y direction.
Figure 7C:
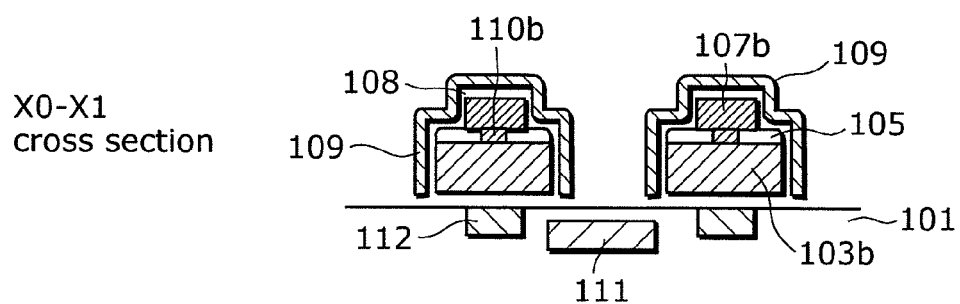
FIG. 7C is a cross-sectional view of a conventional solid-state imaging device taken along X direction.

As shown in FIGS. 6A to 6C, the antireflection film 6 is formed on each insulating region 4 to cover the insulating region 4. The antireflection film 6 is formed on a part of the region above each light-receiving unit 11, and is not formed in the other regions.

To be more specific, each antireflection film 6 formed above a corresponding light-receiving unit 11 is deposited in the corresponding opening 14. Further, as shown in FIG. 6C, the ends of each antireflection film 6 above the light-receiving unit 11 do not reach the regions under the light-shielding film 9. In other words, the antireflection film 6 formed above the light-receiving unit 11 is isolated from the antireflection film 6 formed on the insulating region 4.

As shown in FIG. 6C, the horizontal ends of the antireflection film 6 deposited in a region, in the area above the corresponding second transfer electrode 3b, which is vertically adjacent to the insulating regions 4 do not reach the side surfaces of the second transfer electrode 3b. Likewise, the horizontal ends of the antireflection film 6 deposited in a region, in the area above the corresponding first transfer electrode 3a, which is vertically adjacent to the insulating regions 4 do not reach the side surfaces of the first transfer electrode 3a (not shown). The horizontal cross-sectional view of the region, on the first transfer electrodes 3a side, which is vertically adjacent to the insulating regions 4 is the same as FIG. 6C.

The above structure allows the solid-state imaging device 22 according to Embodiment 3 of the present invention, as with the solid-state imaging device 20 according to Embodiment 1, to prevent the etching for forming the shunt wires 7a and 7b from cutting the insulating regions 4. As a result, as with the solid-state imaging device 20 according to Embodiment 1 of the present invention, the solid-state imaging device 22 according to Embodiment 3 can also achieve higher sensitivity, lower smear, and faster transfer.

Further, the solid-state imaging device 22 according to Embodiment 3 of the present invention does not have the antireflection film 6 between the ends of the light-shielding film 9 and the semiconductor substrate 1, along the side surfaces of the first transfer electrodes 3a and the second transfer electrodes 3b. This makes the thickness of a film between the ends of the light-shielding film 9 and the semiconductor substrate 1 thinner. More specifically, as shown in FIG. 1D, the solid-state imaging device 20 according to Embodiment 1 has the antireflection film 6 under the ends of the light-shielding film 9, along the side surfaces of the second transfer electrodes 3b. Thus, in this case, the thickness W6 of the films between the ends of the light-shielding film 9 and the semiconductor substrate 1 equals a sum of the thickness of the insulating film 2 and the thickness of the antireflection film 6. On the other hand, as shown in FIG. 6C, the solid-state imaging device 22 according to Embodiment 3 does not have the antireflection film 6 under the ends of the light-shielding film 9, thereby reducing the thickness W7 of the film between the ends of the light-shielding film 9 and the semiconductor substrate 1.

Here, when there is a large thickness between the ends of the light-shielding film 9 and the semiconductor substrate 1, oblique light entering from the region therebetween causes a problem of greater smear. By reducing the thickness W7 of the film between the ends of the light-shielding film 9 and the semiconductor substrate 1, the solid-state imaging device 22 according to Embodiment 3 of the present invention can suppress the oblique light entering from the region therebetween. This enables the solid-state imaging device 22 according to Embodiment 3 of the present invention to achieve low smear.

Further, as shown in FIG. 1D, the solid-state imaging device 20 according to Embodiment 1 also has the antireflection film 6 between the side surfaces of the second transfer electrodes 3b and the light-shielding film 9 covering the side surfaces of the second transfer electrodes 3b. This causes the horizontal width L2 of the opening 14 to be narrow. On the other hand, as shown in FIG. 6C, the solid-state imaging device 22 according to Embodiment 3 does not have the antireflection film 6 between the side surfaces of the second transfer electrodes 3b and the light-shielding film 9 covering the side surfaces of the second transfer electrodes 3b. This allows the solid-state imaging device 22 according to Embodiment 3 to increase the horizontal width L3 of the opening 14 as compared to the solid-state imaging device 20 according to Embodiment 1. This enables the solid-state imaging device 22 according to Embodiment 3 of the present invention to achieve higher sensitivity.

The method for manufacturing the solid-state imaging device 22 is the same as in Embodiment 1, and thus the description thereof is omitted.

The present invention is not limited to the above descriptions in Embodiments 1 to 3, and various modifications are possible within the scope of the present invention.

For example, the values, materials and so on in Embodiments 1 to 3 have been given as examples, and the present invention is not to be limited to them.

Further, although the corners and the sides of each structural element are drawn with straight lines in the drawings, corners and sides which are curved due to manufacturing circumstances are also included in the present invention.

Although only some exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

INDUSTRIAL APPLICABILITY

The present invention is applicable to solid-state imaging devices, the examples of which include digital still cameras and digital video cameras.

What is claimed is:

1. A solid-state imaging device comprising:
a semiconductor substrate;
a plurality of light-receiving units which are formed in rows and columns on said semiconductor substrate and convert incident light into signal charge;
a transfer channel formed in each of the columns for transferring, in a column direction, the signal charge obtained as a result of the conversion by said plurality of light-receiving units in a corresponding one of the columns;
a plurality of first transfer electrodes and a plurality of second transfer electrodes that are formed in a same layer and deposited alternately above said transfer channel in the column direction;
insulating regions each of which is formed above said transfer channel and between one of said plurality of first transfer electrodes and one of said plurality of second transfer electrodes which are adjacent to each other in the column direction;
an antireflection film formed above said plurality of light-receiving units to prevent reflection of light entering said plurality of light-receiving units, and formed on said insulating regions to cover said insulating regions;
a first wire formed in each of the rows in a layer upper than said antireflection film, and electrically connected to a plurality of second transfer electrodes, among said plurality of second transfer electrodes, which are deposited in a corresponding one of the rows; and
a light-shielding film which is formed in a layer upper than said first wire, covers said transfer channel, and has an opening above each of said plurality of light-receiving units.

2. The solid-state imaging device according to claim 1, further comprising a second wire formed in each of the rows in a layer upper than said antireflection film, and formed above a plurality of first transfer electrodes, among said plurality of first transfer electrodes, which are deposited in a corresponding one of the rows, said second wire being electrically connected to said plurality of first transfer electrodes deposited in the corresponding one of the rows, wherein said antireflection film is formed at least in part of a region above said plurality of first transfer electrodes and under said second wire.

3. The solid-state imaging device according to claim 2, further comprising a plurality of contacts each of which electrically connects said second wire and one of said plurality of first transfer electrodes which is deposited in one of the rows corresponding to said second wire, wherein said antireflection film is formed to cover said plurality of first transfer electrodes except regions of said plurality of contacts.

4. The solid-state imaging device according to claim 1, wherein a part of said antireflection film formed above one of said plurality of light-receiving units is deposited in the opening, and horizontal ends of the part of said antireflection film formed above the one of said plurality of light-receiving units do not reach regions under said light-shielding film.

5. The solid-state imaging device according to claim 1, wherein a part of said antireflection film formed on one of said insulating regions to cover the one of said insulating regions covers a part of a region above one of said plurality of first transfer electrodes adjacent to the one of said insulating regions and a part of a region above one of said plurality of second transfer electrodes adjacent to the one of said insulating regions, horizontal ends of the part of said antireflection film formed above the one of said plurality of first transfer electrodes do not reach side surfaces of the one of said plurality of first transfer electrodes, and horizontal ends of the part of said antireflection film formed above the one of said plurality of second transfer electrodes do not reach side surfaces of the one of said plurality of second transfer electrodes.

6. The solid-state imaging device according to claim 1, wherein said antireflection film is made of silicon nitride.

7. A method for manufacturing a solid-state imaging device, said method comprising:

forming, in rows and columns on a semiconductor substrate, a plurality of light-receiving units which convert incident light into signal charge;

forming a transfer channel in each of the columns for transferring, in a column direction, the signal charge obtained as a result of the conversion by the plurality of light-receiving units in a corresponding one of the columns;

forming, in a same layer, a plurality of first transfer electrodes and a plurality of second transfer electrodes which alternate above the transfer channel in the column direction;

forming each of insulating regions above the transfer channel and between one of the plurality of first transfer electrodes and one of the plurality of second transfer electrodes which are adjacent to each other in the column direction;

forming an antireflection film above the plurality of light-receiving units to prevent reflection of light entering the plurality of light-receiving units and on the insulating regions to cover the insulating regions;

forming a first wire in each of the rows in a layer upper than the antireflection film, the first wire being electrically connected to a plurality of second transfer electrodes, among the plurality of second transfer electrodes, which are deposited in a corresponding one of the rows; and forming a light-shielding film in a layer upper than the first wire and the antireflection film, the light-shielding film covering the transfer channel and having an opening above each of the plurality of light-receiving units.

8. The method for manufacturing a solid-state imaging device according to claim 7, wherein in said forming of a first wire, the first wire is formed by forming a first conductive film and then etching the first conductive film.

9. The method for manufacturing a solid-state imaging device according to claim 7, wherein said forming of a plurality of first transfer electrodes and a plurality of second transfer electrodes includes:

forming a second conductive film;

forming an insulating film on the second conductive film;

forming a first insulating film pattern by etching the insulating film;

forming a second insulating film pattern by forming a side wall on a side surface of the first insulating film pattern, the second insulating film pattern including the first insulating film pattern and the side wall; and forming the plurality of first transfer electrodes and the plurality of second transfer electrodes by etching the second conductive film using the second insulating film pattern as a mask.

\* \* \* \* \*